United States Patent [19]
Glatfelter et al.

[11] Patent Number: 5,232,519
[45] Date of Patent: Aug. 3, 1993

[54] WIRELESS MONOLITHIC PHOTOVOLTAIC MODULE

[75] Inventors: Troy Glatfelter, Royal Oak; Craig Vogeli, New Baltimore; Prem Nath, Rochester Hills, all of Mich.

[73] Assignee: United Solar Systems Corporation, Troy, Mich.

[21] Appl. No.: 828,002

[22] Filed: Jan. 30, 1992

Related U.S. Application Data

[63] Continuation-in-part of Ser. No. 585,661, Sep. 19, 1990, Pat. No. 5,110,370.

[51] Int. Cl.⁵ ............... H01L 31/048; H01L 31/0224
[52] U.S. Cl. ..................... 136/256; 136/258; 136/259
[58] Field of Search ............ 136/256, 258 AM, 259

[56] References Cited

U.S. PATENT DOCUMENTS

| | | | |
|---|---|---|---|
| 3,943,003 | 3/1976 | Dendall | 136/256 |
| 3,973,994 | 8/1976 | Redfield | 136/259 |
| 4,053,327 | 10/1977 | Meulenberg, Jr. | 136/356 |
| 4,072,541 | 2/1978 | Meulenberg et al. | 136/255 |
| 4,379,202 | 4/1983 | Chalmers | 136/256 |
| 4,453,030 | 6/1984 | David et al. | 136/256 |
| 4,608,451 | 8/1986 | Landis | 136/256 |
| 4,633,033 | 12/1986 | Nath et al. | 136/256 |
| 4,698,455 | 10/1987 | Cavicchi et al. | 136/256 |
| 4,711,972 | 12/1987 | O'Neill | 136/246 |
| 5,110,370 | 5/1992 | Vogeli et al. | 136/256 |

OTHER PUBLICATIONS

"Improvements in Silicon Concentrator Cells", J. Zhao, A. Wang, A. W. Blakers, M. A. Green, Solar Photovoltaic Laboratory, pp. 581-586 in Proceedings, 4th Int'l PVSEC, Austrailia, Feb. 1989, vol. 2.

"Solar Cells for Solar Power Satellites", H. Oman, Boeing Aerospace Company, pp. 133-138, in Proc. European Symp. on Photovoltaic Generators in Space (ESTEC), Sep. 1978.

*Primary Examiner*—Aaron Weisstuch
*Attorney, Agent, or Firm*—Krass & Young

[57] ABSTRACT

A wireless, monolithic photovoltaic module. The module includes top and bottom, rectangular electrodes with a photovoltaic body and an adjacent insulating strip sandwiched in between the electrodes, the insulating strip being disposed proximate the edge of the bottom electrode. A bus bar overlies the insulating strip, but not the photovoltaic body, and is connected to a net of current carrying grid lines which overlie the photovoltaic body to form a current collector. A top encapsulating layer has diffractive grooves formed therein which overlie the grid lines to minimize shading effects otherwise caused by shadows from the grid lines.

6 Claims, 4 Drawing Sheets

WIRELESS MONOLITHIC PHOTOVOLTAIC MODULE

REFERENCE TO RELATED APPLICATION

This application is a continuation-in-part of U.S. patent application Ser. No. 585,661, filed on Sep. 20, 1990, now U.S. Pat. No. 5,110,370.

FIELD OF THE INVENTION

This invention relates generally to photovoltaic devices. More specifically, the invention relates to photovoltaic devices with increased efficiency resultant from the minimization of shading effects caused by current-collecting grids.

BACKGROUND OF THE INVENTION

Photovoltaic energy is becoming a very significant power source for several reasons. Fossil fuels are becoming scarcer, and hence more expensive, every day. Furthermore, the burning of fossil fuels releases pollutants, including greenhouse gases which contribute to problems of global warming. Also, recent events have raised questions as to the safety and cost-effectiveness of nuclear power. For these reasons, traditional energy sources have become far less attractive. Photovoltaic energy, on the other hand, is inherently non-polluting, safe and silent. In addition, recent advances in photovoltaic technology have significantly increased the efficiency, and decreased the cost, of such devices.

For example, it is now possible to manufacture large area silicon and/or germanium alloy materials which manifest electrical, optical, chemical, and physical properties equivalent, and in many instances superior to, their single crystalline counterparts. Layers of such alloys can be economically deposited at high speed over relatively large areas and in a variety of stacked configurations. Such alloys readily lend themselves to the manufacture of low cost photovoltaic devices. Examples of particular fluorinated semiconductor alloy materials having significant utility in fabrication of photovoltaic devices are described in U.S. Pat. No. 4,226,898 and U.S. Pat. No. 4,217,374, both invented by Ovshinsky et al, the disclosures of which are incorporated herein by reference.

In a typical large area photovoltaic device, a number of current-collecting structures are employed to convey photo-generated current to a terminal or other collection point. As used herein, these various structures will be referred to as "current-collecting grids" or "gridlines," these terms being understood to include both grids and bus bars as well as any other opaque conductors associated with the light incident side of photovoltaic devices. Use of current-collecting grids is necessary to withdraw power from the photovoltaic device; however, these grids are typically made of high electrical conductivity material such as deposited metal patterns, adhesively adhered metal tapes, metal-containing pastes, metallic inks, or plated layers and are quite opaque. The gridlines shade underlying portions of the photovoltaic device, thereby preventing it from generating power. Clearly, the gridlines are needed to allow for the efficient withdrawal of photo-generated current, but their presence also detracts from the overall efficiency of the cell. The lines can be made smaller; however, this increases their electrical resistance and thereby tends to decrease cell efficiency. Under the constraints of the prior art, a designer of photovoltaic devices is caught in a dilemma of having to balance the electrical resistance of the cell versus the amount of active area presented for illumination.

In some instances, prior art cells relied upon the use of relatively thin deposits of high conductivity metals such as pure gold, silver, or copper to provide high conductivity, relatively small area gridlines. However, such approaches require the use of sophisticated photolithograhic techniques for patterning the gridlines. Additionally, the length of such thin gridlines was limited by the need to avoid high resistivity; consequently, this approach is limited in size and is quite expensive. Lower cost, easier to apply gridlines prepared from paste or ink material are quite desirable; however, they are of lower conductivity and hence must be made fairly thick and wide to achieve sufficient current carrying capabilities. Such materials were not heretofore practical since the gridlines they provide create a high level of shading. What is needed is a method and structure which permits the use of relatively wide gridline patterns, while minimizing shading from those gridlines.

Various attempts have been implemented in the prior art to employ optical systems to concentrate light in areas remote from gridlines. Such approaches involve the use of prismatic arrays and the like. These arrays are typically supported in a spaced-apart relationship with the photovoltaic device or they are adhesively affixed to the light incident side of the device and, when properly aligned, redirect light falling in the region of gridlines to grid-free portions of the device. This technology is typically employed in conjunction with concentrator cells. An overview of this technology is presented by Zhao et al in a paper entitled "Improvements in Silicon Concentrator Cells," published in the Proceedings of the 4th International Photovoltaic Science and Engineering Conference, Sydney, Australia, Feb. 14-17, 1989, Vol. 2, p 581. Use of a Fresnel, lenticular concentrator is also disclosed in U.S. Pat. No. 4,711,972. These prior art approaches employ fairly precise, molded lenses which must either be adhesively affixed to a photovoltaic cell or mounted in a support frame spaced apart from the photovoltaic cell in proper alignment. Use of lenses of this type requires skill in placement and affixation. If the lenses are misaligned, they will be worse than useless since they will direct light to, rather than away from, the gridlines. In use, conditions such as ambient heat and/or mechanical impact can misalign the lens element, thereby decreasing cell efficiency.

What is needed is a photovoltaic device having decreased shading from gridlines, which device does not necessitate the precise placement and adhesive affixation of a separate lens element. The present invention provides for an improved photovoltaic cell having decreased shading as well as for a simple method of manufacturing that cell. According to the present invention, light-directing optics are formed integral with the photovoltaic device as a step in its manufacture. This results in a low cost, high efficiency, high accuracy process for the manufacture of photovoltaic devices having increased efficiencies. The method of the present invention may be adapted for the manufacture of single cells as well as for the manufacture of modules comprised of interconnected cells. These and other advantages of the present invention will be readily apparent from the drawings, discussion and description which follow.

SUMMARY OF THE INVENTION

There is disclosed herein a method of manufacturing a photovoltaic device having decreased shading from collector gridlines. The method includes the steps of providing a photovoltaic cell which includes a bottom electrode layer, a photovoltaic body disposed atop the bottom electrode layer, and a top electrode layer disposed atop the photovoltaic body. The photovoltaic cell further includes an electrically-conductive, current-collecting gridline associated in electrical communication with the top electrode. The method includes the further step of disposing a layer of embossible, transparent encapsulating material atop the top electrode layer, providing an embossing die which includes at least one groove-forming element thereon and aligning the die with the photovoltaic cell so that the groove-forming element is in registry with at least a portion of the length of the gridline and in contact with the layer of encapsulating material. The method further includes the step of compressing the embossing die and photovoltaic cell so as to emboss a groove into the encapsulant layer and the final step of removing the embossing die. In this manner, there is provided a photovoltaic cell having a groove integral with the encapsulating layer. The groove is operable to direct incident illumination away from the gridline so as to decrease shading effects caused by it. In particular embodiments, the transparent embossible layer is a layer of synthetic organic polymer material such as ethylene vinyl acetate, polytetrafluoroethylene, polyvinyl fluoride, polyvinyl acetate, polystyrene, polyurethane and combinations thereof. In particular embodiments, a two step process is carried out wherein the cell and encapsulant are first laminated to provide a self-supporting structure which is subsequently embossed (and optionally cross-linked) in a second step. In some embodiments, the embossing die is heated and compression is carried out at pressures of approximately one atmosphere. In a particular embodiment, the layer of transparent polymeric material is a layer of thermally cross-linkable material and it becomes hardened while the groove is embossed.

The method of the present invention may be adapted to the manufacture of large area modules comprised of a plurality of interconnected cells and includes the initial step of disposing a plurality of photovoltaic cells onto a support member and encapsulating those cells with a layer of transparent encapsulant material. The method includes a further step of providing a plurality of embossing dies, each including at least one groove-forming element, as well as the steps of aligning the dies with corresponding photovoltaic cells and compressing the dies and cells. Alignment may be accomplished by punching alignment holes into the support portion of the module and providing the dies with pins configured to fit in the holes. In this manner, the dies may be aligned properly with regard to individual strip cells, thereby eliminating problems resulting from slight misalignment between individual cells.

The present invention further includes an improved photovoltaic cell manufactured according to the method and including an optical element formed integral with the encapsulant layer. In a particularly preferred embodiment, the photovoltaic cell is manufactured as a wireless, monolithic module. The wireless, monolithic module includes a bottom electrode bounded by four outside edges to define a rectangle, a strip of insulating material being disposed on said bottom electrode adjacent one of said outside edges. A photovoltaic body is disposed on said bottom electrode adjacent the insulating strip. A top electrode is disposed on the photovoltaic body and the insulating strip in a spaced apart relationship with the bottom electrode and coextensive therewith so that the photovoltaic body and insulating strip are sandwiched between the two electrodes. A plurality of electrically conductive, current-connecting, spaced, parallel gridlines are associated in electrical communication with the top electrode and overlie the photovoltaic body. The plurality of gridlines are each in electrical communication with a bus bar which is disposed on the device so as to overlie the insulating strip. A layer of transparent, electrically-insulating synthetic organic polymeric material is disposed on top of the device so as to cover the top electrode, the bus bar and the gridlines. The encapsulating layer has a separate groove formed integrally therein is generally coextensive with each of the plurality of gridlines along their lengths. These grooves are operative to diffract incident light away from the underlying gridlines so that the incident light illuminates adjacent portions of the cell module to minimize shading effects otherwise caused by the gridlines.

DETAILED DESCRIPTION OF THE INVENTION

Figure 1:
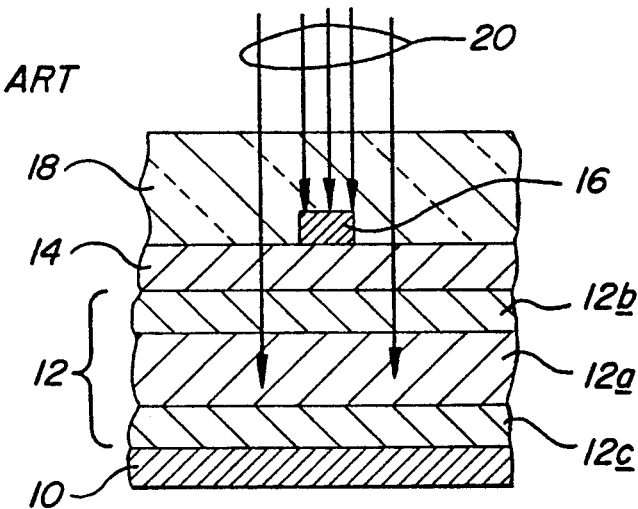
FIG. 1 is a cross-sectional view of a portion of a photovoltaic cell of the prior art illustrating the problem of gridline shading.

Referring now to FIG. 1, there is shown a cross-sectional view of a portion of a photovoltaic cell of the prior art illustrating the problem of gridline shading. The cell includes a substrate 10, which in this instance is a metallic substrate which also functions as a bottom electrode layer. Disposed immediately atop the electrically-conductive substrate 10 is a body of photovoltaic material 12 and immediately thereatop on the light incident side of the photovoltaic body 12, is a top electrode layer 14. The top electrode layer 14 is most preferably fabricated from a transparent material so as to permit passage of light therethrough. Associated with the top electrode layer 14 is a gridline 16 which operates to collect current from the top electrode layer 14 and carry it to a bus bar or other terminal. The top, i.e. light incident, surface of the photovoltaic device is protected by a layer of transparent, encapsulant material 18.

There are a great variety of materials which may be utilized to manufacture the photovoltaic devices of the present invention. The bottom electrode layer is fabricated from an electrically-conductive material and as noted hereinabove, may also function as a support substrate for the device. Toward that end, one preferred material is stainless steel of approximately 8 mils thickness. Other substrates include electrically-insulating materials such as polymeric bodies, glass or ceramics and, in such instances, the electrode layer will be deposited thereatop. The photovoltaic body 12, as is well known to those of skill in the art, operates to absorb incident photons and to generate electron-hole pairs in response thereto, and to separate the members of these pairs and direct them to the respective electrodes 10,14 of the cell. There are a great variety of photovoltaic materials known to those of skill in the art and the present invention is not limited to any one such material. Among some of the preferred materials are the thin film materials such as the fluorinated silicon and germanium alloys referred to hereinabove, as well as cadmium telluride, gallium arsenide, copper indium diselenide, single crystal silicon, and the like. In one particularly preferred embodiment, the photovoltaic body comprises at least one triad of silicon alloy material which includes a layer of intrinsic material 12a interposed between N-type 12b and P-type 12c alloy materials. In one preferred embodiment, at least one of the N-type 12b and P-type layers 12c is a microcrystalline layer, preferably the layer proximate the light incident side of the photovoltaic device. In some instances, a number of triads of N-I-P (or P-I-N) type materials are stacked one atop another to provide for enhanced efficiency and sensitivity.

The top electrode layer 14, as noted hereinabove, is preferably a transparent body and there are available a number of highly degenerate semiconductors such as indium-tin oxide and the like which may be employed as top electrode layers. The gridline 16 is preferably fabricated from an electrically-conductive ink or paste or it may be a metallic body adhered to the top electrode layer. In some instances, the gridline 16 is placed beneath or embedded within the top electrode layer 14. For this reason, and within the context of the present invention, the gridline 16 is described as being electrically associated with the top electrode layer 14. The layer of encapsulant material 18 protects the components of the photovoltaic cell from the ambient environment and from mechanical damage. The encapsulant layer 18 is preferably fabricated from a material which is highly transparent and inert. Organic polymers comprise the most preferred materials for this layer and ethylene vinyl acetate (EVA) is one particularly preferred material. Cross-linkable ethylene vinyl acetate having particular utility in the present invention is sold by the Du Pont de Nemours, E. I. & Company. Other preferred materials include fluorocarbon polymers, polyurethane, polystyrene, and polyvinyl acetate as well as various silicon compounds. In some instances, a bi-layered structure of fluoropolymer/EVA is employed.

FIG. 1 illustrates the manner in which prior art photovoltaic cells suffered from problems of gridline shading. As will be noted, a photon flux 20 is shown as incident upon the device. Those photons which strike the gridline 16 are absorbed, or in some instances reflected, and hence not available to penetrate the photovoltaic body and generate charge carriers. These photons effectively represent a loss in the efficiency of the cell.

Figure 2:
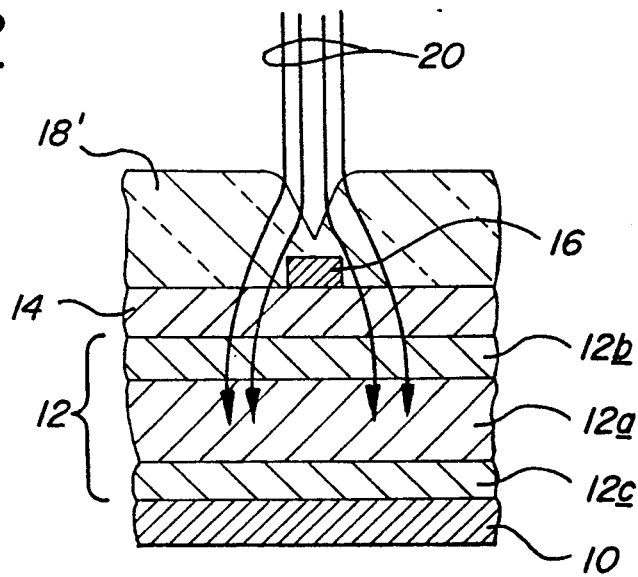
FIG. 2 is a cross section of a portion of a photovoltaic cell configured in accord with the principles of the present invention and illustrating the manner in which the present invention operates to minimize gridline shading.

Referring now to FIG. 2, there is shown a photovoltaic device generally similar to that of FIG. 1, but including the improvement of the present invention which comprises a transparent encapsulating layer 18' configured to include an integral optical element in a form of a groove disposed in the region of the gridline 16. The particularly configured transparent encapsulant layer 18' operates to diffract incident light 20 away from the gridline 16 and into the photovoltaic body 12. In this manner, shading losses occasioned by the presence of the gridlines 16 are minimized. As a consequence, gridlines may be made wider and hence longer and the cell size may be greatly increased. Since the light-directing optical element of the present invention is provided integral with the transparent encapsulating layer 18', problems attendant upon the alignment and adherence of a separate optical element are eliminated. In accord with the principles of the present invention, the grooved optical element is formed in the layer only after the encapsulation of the photovoltaic cell, and problems occasioned by the misalignment and/or detachment of a separate optical element are eliminated.

Figure 3:
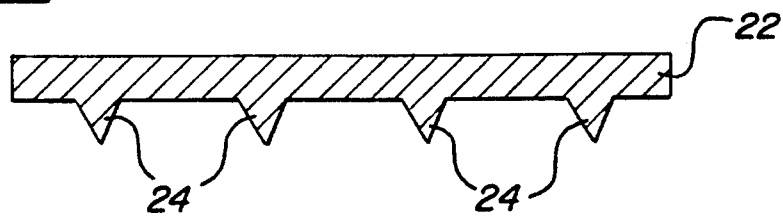
FIG. 3 is a cross-sectional view of one embossing die which may be utilized in the practice of the present invention.

In the most preferred embodiment of the present invention, the grooved optical element is formed in the transparent encapsulating layer by an embossing process employing a die generally similar to that depicted to that in cross section in FIG. 3. The die 22 of FIG. 3 is preferably fabricated from a metal, ceramic, or similar durable material having good heat transfer characteristics and includes a number of groove-forming projections 24 upon the face thereof. The spacing between adjoining groove-forming portions is selected to correspond to the spacing between grid fingers in a given configuration of photovoltaic device.

In accord with the method of the present invention, a photovoltaic cell is first provided with a top encapsulant layer, such as the polymeric layer 18 described with reference to FIG. 1. This layer is affixed by a laminating process carried out a moderate temperature so as to avoid cross-linking the encapsulant. The structure thus produced is sufficiently rigid to withstand subsequent handling and processing. In the second step, an embossing die generally similar to that of FIG. 3 is aligned with the photovoltaic cell so that the groove-forming portions 24 thereof are aligned substantially with the grid fingers. At that time, the die 22 and cell are compressed so as to emboss the groove pattern into the transparent layer to produce a structure similar to layer 18' of FIG. 2. The process may be facilitated by heating of the embossing die 22. In general, any combination of parameters which will produce a relatively permanent deformation of the encapsulating layer may be employed. However, it has been found most preferable in accord with the present invention to utilize an encapsulant material which is cross-linkable, i.e. a material which cross links and hardens at elevated temperatures to provide a permanent structure. The aforementioned EVA polymer fulfills these criteria since it initially softens at a temperature of approximately 60° C. and subsequently cross links to form a hard layer at a temperature of approximately 140° C. These properties allow the groove-forming elements to initially penetrate and shape the layer, and subsequently harden it to cause it to retain its shape and the optical characteristics produced thereby. In a typical process employing an EVA layer, the die is heated to approximately 150° C. and a pressure of one atmosphere is maintained on the die for approximately 30 minutes. In some instances, the initial lamination and the embossing may be carried out in a one-step concerted process.

Figure 4:
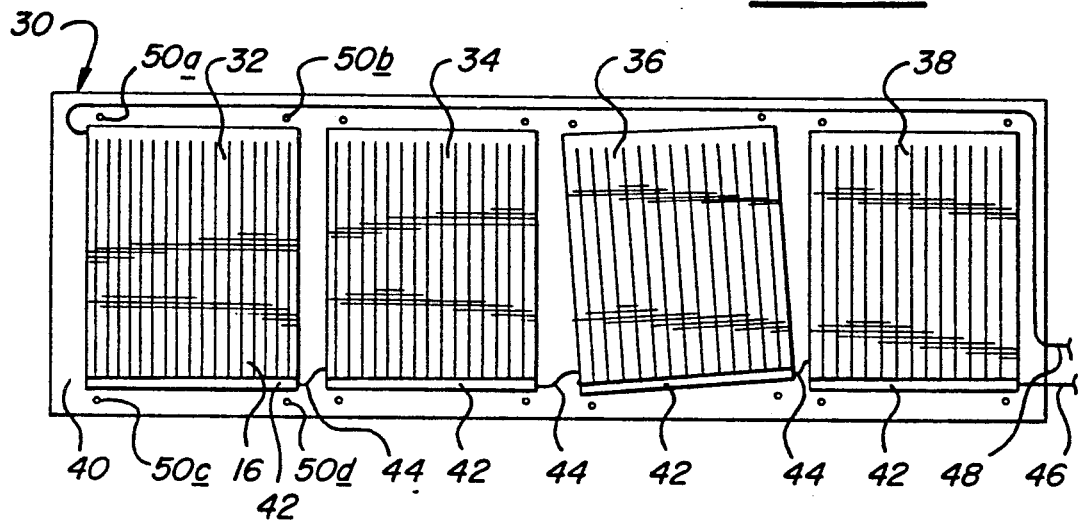
FIG. 4 is a top plan view of a large area photovoltaic module structured in accord with the principles of the present invention.

It is frequently desirable to interconnect smaller area photovoltaic cells into a large area module so as to provide an increased voltage and/or power-producing capability. The present invention may be readily adapted for use in connection with the production of large area modules. Referring now to FIG. 4, there is shown a large area photovoltaic module 30 comprised of four individual photovoltaic cells 32,34,36,38 disposed upon a support substrate 40. The individual cells 32,34,36,38 each include a plurality of gridlines 16 formed thereupon. Each gridline is in electrical communication with a bus bar 42 disposed on the periphery of the cell. The individual cells 32,34,36,38 of the module 30 of FIG. 4 are interconnected in a series relationship by means of electrically-conductive jumpers 44 interconnecting the bus bars 42 of a first cell with the bottom electrode of an adjacent cell. The module further includes a pair of output terminals 46,48 electrically connected to the bus bar 42 and bottom electrode of cell 38. At this stage, the individual cells are laminated into a single large-area device as noted above, by moderate heat and compression (typically 60° C. when EVA is the laminant). It will be noted from the figure that the individual cells 32,34,36,38 are not all evenly aligned on the substrate 40. The present invention provides for a method of embossing the groove pattern into the cells without regard to any alignment requirements between the various cells and thereby simplifies module manufacture. It will be noted from the figure that each of the cells 32,34,36,38 has four alignment holes 50a,50b,50c,50d associated therewith. After the initial lamination, these holes are punched through the substrate 40 and are oriented with regard to the orientation of the individual cell and serve as alignment guides for placement of the embossing die. Punching of the alignment holes 50, may be accomplished by the use of a template having indicia which are aligned with the grid pattern or other feature of the cell and which serve to properly position the punches.

Figure 5:
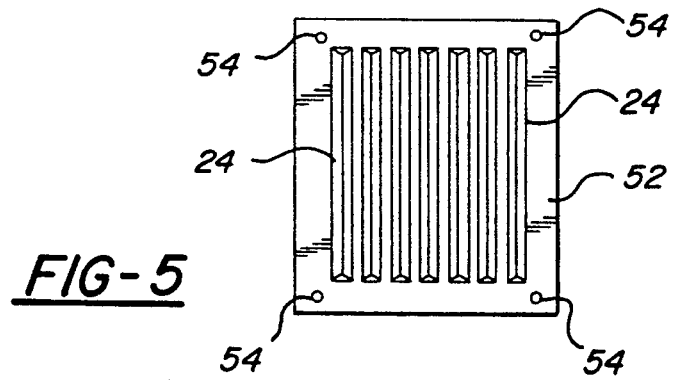
FIG. 5 is a top plan view of an embossing die of the type utilized to manufacture the module of FIG. 4.

Referring now to FIG. 5, there is shown a top plan view of an embossing die 52 generally similar to that illustrated in FIG. 3 but further including four alignment pins 54 thereupon. These pins, when placed into the corresponding pin holes in the module, serve to align the groove-forming elements 24 of the die 52 with the gridlines 16. When the module is to be completed, individual dies are placed in registry with each cell through the use of the alignment pins 54 and the entire assembly is compressed, preferably with heating, to effect groove formation.

Figure 6:
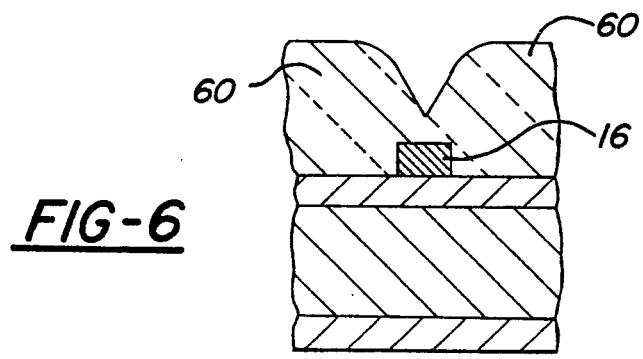
FIG. 6 is a cross-sectional view of a portion of a photovoltaic cell illustrating another configuration of groove employed in accord with the present invention.

While the foregoing figures depicted the grooves as being straight-sided grooves having flattened areas therebetween, the present invention may be practiced with other groove structures. For example, FIG. 6 depicts a curved groove structure having rounded, lenticular portions 60 between adjoining grid fingers 16. Many other variations will be readily apparent to one of skill in the art. For example, by selecting the width and angle of the grooves, the acceptance of illumination may be varied to account for seasonal variations in the direction of insolation. Wider grooves will tend to gather more light; however, a groove which is too wide can cause redirection of light onto adjoining grid fingers. One of skill in the art could readily control the parameters of finger spacing and groove shapes so as to achieve a minimization of shading and a maximization of power output.

Figure 7A:
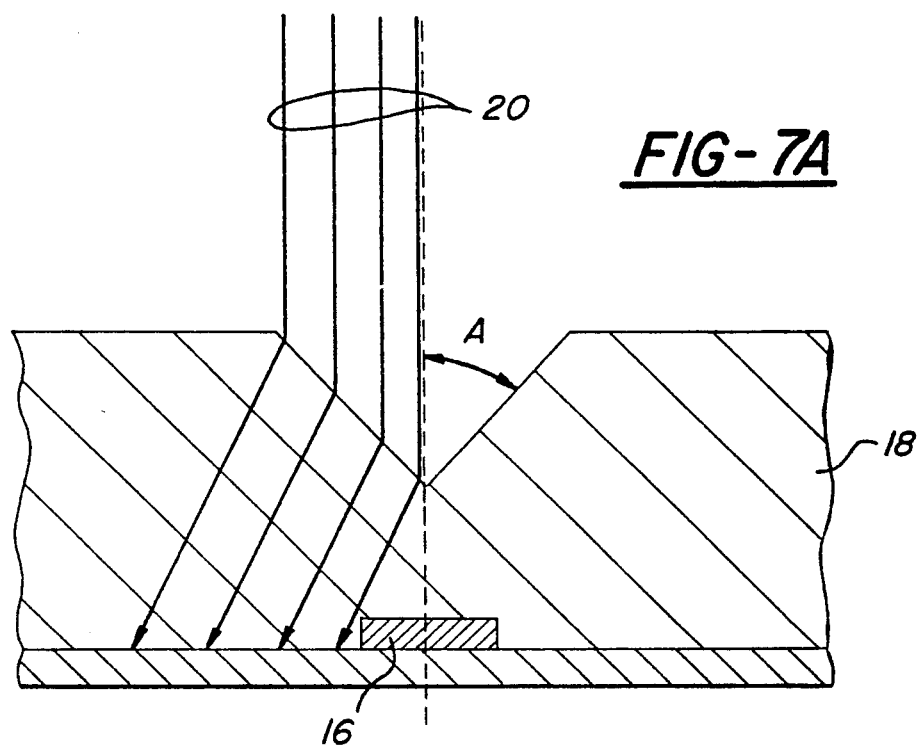
FIG. 7A is a cross-sectional view of a photovoltaic cell illustrating one particular configuration of groove structured in accord with the present invention.
Figure 7B:
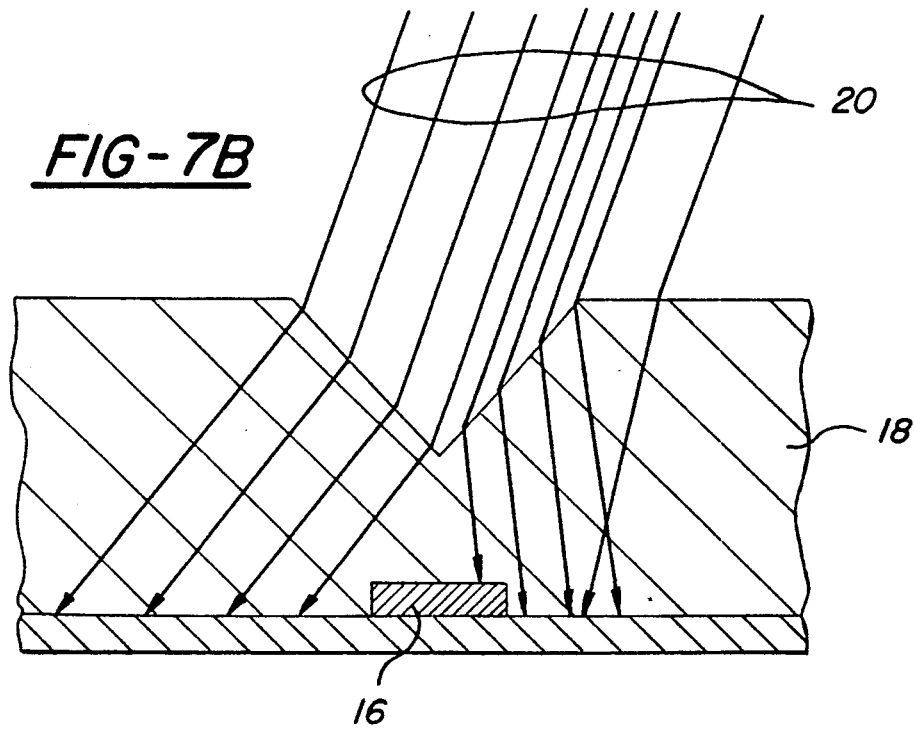
FIG. 7B is a cross-sectional view of the cell of FIG. 7A, illuminated at an oblique angle.

FIGS. 7A and 7B illustrate one particular configuration of groove width and angle as optimized to accommodate the varying angles of insolation. FIG. 7A depicts one particular configuration of photovoltaic device structured in accord with the principles of the present invention. The device of FIG. 7A includes a top encapsulating layer 18, generally similar to those previously described and being approximately 0.95 millimeters in thickness. The device further includes a gridline 16 which is 0.3 millimeters in width. The groove formed in the encapsulant layer forms an angle "A" of approximately 42° with the perpendicular bisector of the groove indicated by the dotted line. The width of the groove as measured across the top of the layer 18 is approximately 0.8 millimeters.

As illustrated in FIG. 7A, a flux of light 20 is incident upon the device in a direction perpendicular to the top surface of the device. As will be noted, the light is directed away from the gridline 16. FIG. 7B is a depiction of the same photovoltaic device having light flux 20 incident at an angle of approximately 70° (20° off the perpendicular) to the surface thereof. It will be noted that the particular configuration of groove still functions to greatly minimize shading. Only a small portion of the light is actually incident upon the gridline 16.

Figure 9:
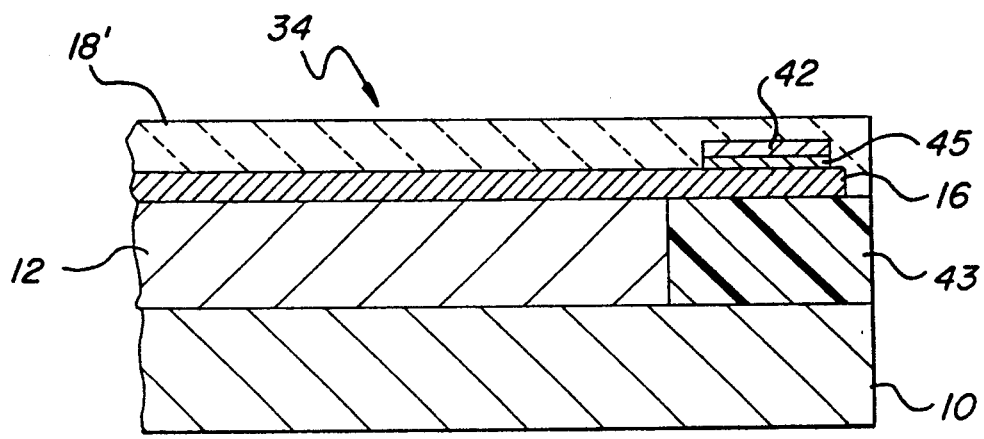
FIG. 9 is a cross section of the detail view of FIG. 8 taken along lines 9—9.
Figure 8:
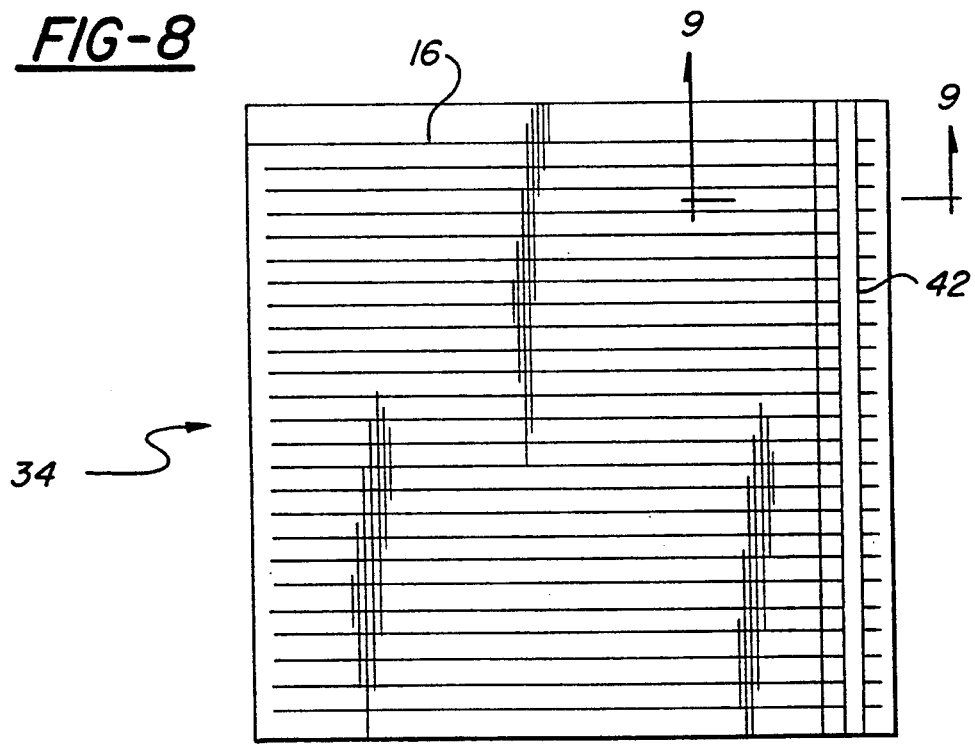
FIG. 8 is a detail view of a portion of one of the photovoltaic modules shown in FIG. 4.

A particularly preferred embodiment of the photovoltaic cell 34 (shown in an array of similar cells in FIG. 4) is shown in detail in FIGS. 8 and 9. In the embodiment depicted in FIGS. 8 and 9, the photovoltaic cell 34 is designed as a module for connection with other cells in the manner depicted in FIG. 4, or for use as a single cell module. In the embodiment of cell module 34 depicted in FIGS. 8 and 9, electric power generated by photovoltaic body 12 is collected by means of a plurality of spaced, parallel gridlines 16 which cover the cell module 34 and are in electrical communication with bus bar 42. Bus bar 42 is disposed along an edge of cell module 34 and may be provided with electrical connectors 44, as depicted in FIG. 4.

The construction of this embodiment of photovoltaic module 34 is more clearly shown in FIG. 9, which is a cross-sectional view of the detail view of FIG. 8. As can be seen in FIG. 9, the module 34 includes a substrate 10 (preferably formed of an electrically conductive substance such as stainless steel) which also serves as the bottom electrode of the device 34. A photovoltaic body 12 is disposed atop substrate 10 and include those elements previously described with reference to FIGS. 1 and 2. The photovoltaic module 34 further comprises a strip 43 of electrically insulating material which is disposed proximate an edge of substrate 10. One of the plurality of gridlines 16 overlies portions of photovoltaic element 12 and insulating strip 43, and is disposed at right angles to insulating strip 43. As explained previously, gridline 16 is associated with a top electrode not visible in this cross-sectional view. Bus bar 42 is disposed atop the plurality of gridlines 16 and insulating strip 43. It intersects all of the gridlines 16 so that they are in electrical communication with bus bar 42. Preferably, bus bar 42 is formed of a strip of copper or silver tape which is adhered to the gridlines 16 by means of a layer of silver adhesive paste 45. The silver adhesive paste is electrically conductive so that current collected by the plurality of gridlines 16 is transmitted to bus bar 42, where it is available for use by tapping it by means of, for example, an electrical connector 44.

An encapsulating layer 18' incorporates the top electrode 14, the plurality of gridlines 16, the bus bar 42, and the layer of silver paste 45. As explained previously, a plurality of grooves are formed in the surface of encapsulating layer 18. In the embodiment depicted in FIGS. 4, 8, and 9, there is a groove formed integrally in encapsulating layer 18' which is coextensive with each of the plurality of gridlines 16 along their lengths. Thus, the grooves are spaced in encapsulating layer 18' at the same intervals as the gridlines 16, and the pattern of grooves must be in registry with the pattern formed by the plurality of gridlines 16. Thus, the grooves will diffract incident light away from the underlying gridlines 16 so that incident light will illuminate adjacent portions of the photovoltaic cell module 34 to minimize shading effects caused by the gridlines 16.

Preferably, the plurality of gridlines 16 in the photovoltaic cell module 34 depicted in FIGS. 8 and 9 are spaced at approximately 1 millimeter intervals. Each of said plurality of gridlines 16, preferably, have a width of approximately 150-200 micrometers. With gridlines 16 of the defined width and spaced at the defined pitch, the photovoltaic module 34 will have approximately 15% of its surface area covered by the plurality of gridlines 16. Normally, a prior art cell module having a similar pattern of gridlines attached to a bus bar would exhibit a significant loss of efficiency due to the shading caused by the gridlines. While making the gridlines narrower and increasing the pitch distances causes less shading and would be expected to increase efficiency, actually the opposite effect occurs because the resistance of the gridlines increases as their width decreases. Similarly, the farther apart they are, the less efficiently they collect electricity. For example, in a typical prior art cell, if the pitch is 0.69 millimeters (relatively narrow spacing) and each gridline is 200 microns wide, the cell will experience an electrical loss of approximately 1.1%. Decreasing the width of each gridline to 150 microns actually has the effect of increasing the electrical loss to 1.3%. Similarly, increasing the pitch to 1.2 millimeters (relatively wide spacing) increases the electrical loss for 200 micron wide gridlines to 2.8%. The loss is even greater for narrower gridlines of 150 microns, namely, 3.2%.

Thus, it can be seen that it is advantageous up to a point to increase the width of the gridlines, and to decrease the spacing between them. That is, up to a point, the lower resistance of the wider gridlines and the greater collection efficiency caused by narrower spacing will more than compensate for the loss caused by greater obstruction of the surface area of the photovoltaic cell due to wider, more narrowly spaced gridlines. However, by employing the grooved encapsulant surface disclosed and claimed herein, the losses caused by shading are greatly reduced. Thus, the grooved photovoltaic device of the present invention most effectively is employed with a power collection grid which uses wider gridlines which are more narrowly spaced. In this way, losses due to shading are minimized, losses due to resistance are minimized, and collection efficiency is maximized.

The wireless, photovoltaic module of the present invention has no front surface wiring. The current carrying gridlines are printed or plated onto the surface of the photovoltaic body. These gridlines are protected from the grounded edge of the substrate by means of the insulator strip. Therefore, the cell module of the present invention may be easily manufactured, thus lowering production costs.

The wireless, photovoltaic cell module of the present invention has the further advantage of presenting a non-glare, surface appearance. This effect is achieved if the module is disposed on an angled surface (such as a roof) with the gridlines running horizontally; that is, the module is disposed so that the gridlines and grooves overlying them run across, rather than up and down, the angled surface. The angled surface will then have a non-glare appearance. Additionally, the overlying grooves will "hide" the gridlines since the grooves diffract the incident light into adjacent areas of the cell module and away from the gridlines, themselves. Thus, the gridlines are "invisible" to an observer viewing the module head on.

The particular angle and width of a groove will depend upon the thickness of the underlying layer and the width of the gridline. Calculation of groove configuration may be readily undertaken by one of skill in the art employing basic principles of optics. Clearly, configurations other than those shown herein will be readily apparent to one of skill in the art in view of the drawings, discussion and description which are included herein. The foregoing are illustrative of particular embodiments of the present invention and are not limitations upon the practice thereof. It is the following claims, including all equivalents, which define the scope of the invention.

We claim:

1. A photovoltaic cell module having decreased shading, said module comprising:
    a bottom electrode bounded by four outside edges to define a rectangle;
    a strip of electrically insulating material disposed on said bottom electrode proximate one of said outside edges thereof;
    a photovoltaic body disposed on said bottom electrode adjacent said insulating strip;
    a top electrode disposed on said photovoltaic body and said insulating strip in a spaced apart relationship with said bottom electrode and coextensive therewith so that the photovoltaic body and insulating strip are sandwiched therebetween;
    a plurality of electrically conductive, current-collecting, parallel, spaced gridlines associated in electrical communication with said top electrode and overlying said photovoltaic body;
    an electrically conductive, current-collecting bus bar overlying said insulating strip and in electrical communication with the plurality of gridlines; and
    an encapsulating layer of transparent, electrically insulating synthetic organic polymeric material disposed directly upon said top electrode, said plurality of gridlines, and said bus bar, said encapsulating layer having a groove formed integrally therein generally coextensive with each of said plurality of gridlines along the length thereof, said grooves being operative to diffract incident light away from the underlying gridlines so that said light illuminates adjacent portions of said photovoltaic cell module, thereby minimizing shading effects caused by said gridlines.

2. The cell module of claim 1 wherein said bus bar is formed of a strip of copper tape adhered to said gridlines by means of silver paste.

3. The cell module of claim 1 wherein said plurality of gridlines is spaced at approximately 1 millimeter intervals.

4. The cell module of claim 3 wherein each of said plurality of gridlines has a width of approximately 150-200 microns.

5. The photovoltaic cell of claim 4 wherein said plurality of gridlines cover approximately 15% of the surface area of said module.

6. The cell module of claim 1 wherein said module has a non-glare surface appearance.

* * * * *